United States Patent
Biber et al.

(10) Patent No.: US 9,234,950 B2
(45) Date of Patent: Jan. 12, 2016

(54) AUTOMATIC CONTROL OF THE POWER CONSUMPTION OF A MAGNETIC RESONANCE FACILITY

(75) Inventors: Stephan Biber, Erlangen (DE); Björn Heismann, Erlangen (DE); Volker Matschl, Bamberg (DE); Sebastian Schmidt, Weisendorf (DE); Markus Vester, Nürnberg (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 629 days.

(21) Appl. No.: 13/550,840

(22) Filed: Jul. 17, 2012

(65) Prior Publication Data
US 2013/0181708 A1 Jul. 18, 2013

(30) Foreign Application Priority Data
Jul. 18, 2011 (DE) .......... 10 2011 079 345

(51) Int. Cl.
G01R 33/44 (2006.01)
G01R 33/36 (2006.01)
G01R 33/34 (2006.01)

(52) U.S. Cl.
CPC .......... *G01R 33/44* (2013.01); *G01R 33/34023* (2013.01); *G01R 33/36* (2013.01)

(58) Field of Classification Search
CPC ... G01R 33/36; G01R 33/44; G01R 33/34023
See application file for complete search history.

(56) References Cited

U.S. PATENT DOCUMENTS

| 2003/0164702 A1 | 9/2003 | Becktold et al. |
| 2009/0096452 A1 | 4/2009 | Gore et al. |
| 2010/0069738 A1 | 3/2010 | Timinger |

FOREIGN PATENT DOCUMENTS

| CN | 101535830 A | 9/2009 |
| DE | 102004038619 A1 | 2/2006 |
| JP | 2003052136 A | 2/2003 |
| WO | WO 2010150168 A1 | 12/2010 |

*Primary Examiner* — Dixomara Vargas

(57) ABSTRACT

A method for operating a magnetic resonance facility is proposed. The magnetic resonance facility has a number of power-consuming components. The power consumption is determined for each component. Operation of the components is controlled based on at least one criterion so that a predetermined threshold value for the overall power consumption of the magnetic resonance facility is not exceeded.

15 Claims, 1 Drawing Sheet

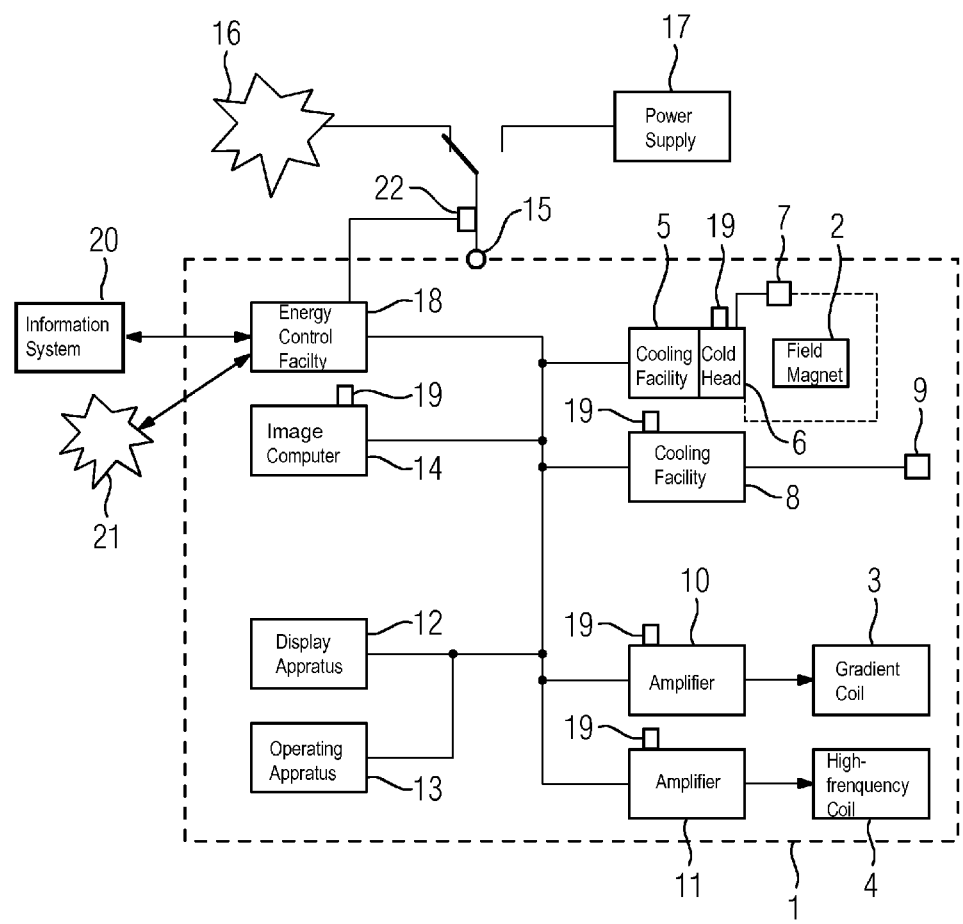

AUTOMATIC CONTROL OF THE POWER CONSUMPTION OF A MAGNETIC RESONANCE FACILITY

CROSS REFERENCE TO RELATED APPLICATIONS

This application claims priority of German application No. 10 2011 079 345.3 filed Jul. 18, 2011, which is incorporated by reference herein in its entirety.

FIELD OF APPLICATION

The application relates to a method for operating a magnetic resonance facility, comprising a number of power-consuming components, and a magnetic resonance facility, comprising a number of power-consuming components.

BACKGROUND OF APPLICATION

In magnetic resonance facilities very powerful magnetic fields are generated, usually by way of a superconducting basic field magnet. Accordingly known magnetic resonance facilities usually have very high specified power ratings, for example around 110 kW. The problem arises of being able to ensure such possible overall power consumption at all times, which is problematic with less well constructed power networks, as such power levels cannot or cannot always be supplied.

The significant power requirement of a magnetic resonance facility having a superconducting coil as its basic field magnet is largely determined here by a series of components of the magnetic resonance facility, for example the cold head of the cooling facility of the basic field magnet, which cools the liquid helium, the cooling facility for the remainder of the system, the gradient amplifier and the high-frequency amplifier. Each of these components must in some instances supply power levels exceeding 10 kW.

One problem here is the high power requirement of the magnetic resonance facility when using emergency power units, since, in order to be able to operate the magnetic resonance facility using the emergency power unit in an emergency, according to the current prior art the power of emergency power unit has to be matched to the theoretical maximum power consumption of the magnetic resonance facility, which is however not achieved in some instances during (rare) operation with emergency power.

To resolve such problems relating to the high power consumption of the magnetic resonance facility, it has been proposed that the power consumption of individual components should be reduced. Provision can thus be made to use regulatable compressors for the cold head or to use efficient coolers, so that it is possible to operate temporarily without compression for example at low ambient temperatures. Alternatively provision can be made for using components with lower power consumption, but these results in an unwanted lower system power. It is also conceivable to use a permanent magnet instead of a superconducting coil, so that the cooling outlay for the superconductor is no longer required but this makes the magnetic resonance facility very heavy and only permits very low field strengths.

SUMMARY OF APPLICATION

The object of the application is to specify operating a magnetic resonance facility more efficiently, allowing a lower maximum rated power consumption to be achieved.

To achieve this object, with a method of the type mentioned in the introduction, provision is made for
 the power consumption to be determined for each component and
 operation of the components to be controlled based on at least one criterion so that a predetermined threshold value for the overall power consumption of the magnetic resonance facility is not exceeded.

It is proposed that maximum permissible overall power consumption should be provided, for example by a corresponding energy control facility, the magnetic resonance facility and the components in question not being permitted to exceed this. The threshold value represents a sort of available "power budget", in other words a budget maximum, compliance with which is automatically monitored, with operation of the components of the magnetic resonance facility being adjusted as a function of certain criteria, for example prioritizations and the like, whenever non-compliance threatens. This is based on the knowledge that it is not necessary with most magnetic resonance facilities for all the components to run in a parallel manner, such as in a parallel manner at maximum power. If the criteria set out a suitable strategy, which will be examined in more detail in the following based on examples, it is then possible to control the power consumption of the components so that more efficient, also energy-saving, operation of the magnetic resonance facility is generally possible. Power peaks can be avoided, as overall power consumption is limited, so the lower maximum overall power consumption means that the requirements for the power network and emergency power supply can also be less stringent.

It should also be noted here that it is not absolutely necessary to monitor the power consumption of all the components of the magnetic resonance facility and add them together to give the overall power consumption; a consideration of the main consumers is sufficient. Provision can thus be made for the considered component to be a cold head of a cooling facility for a basic field magnet and/or a cooling facility for further components of the magnetic resonance facility and/or an amplifier for a gradient coil arrangement and/or an amplifier for a high-frequency coil arrangement. The abovementioned components are characterized in that they are the main contributors to the overall power consumption of the magnetic resonance facility. Naturally other components can also be considered, which require a higher power consumption, for example modern image computers, which can comprise a plurality of processors and assigned cooling facilities. The abovementioned components also have a power saving potential, as will be explained in more detail below. Thus for example a cold head does not have to be operated continuously, if the cooling system tends to respond sluggishly and heating would only take place slowly; power savings can also be achieved by reducing gradient amplitudes and the like. When selecting the components to be monitored, provision can also be made for all components to be considered, the mean or maximum power consumption of which exceeds a limit power.

If there is a threat that the threshold value will be exceeded, in other words the facility will be "over budget", the energy control facility reduces the power consumption of the components, as described above, according to an established strategy, as described by the criteria. In a further embodiment of the present application provision can be made for the considered criteria to be at least one criterion relating to the operating safety of the magnetic resonance facility and/or at least one criterion relating to planned performance, with a criterion relating to operating safety being prioritized over a criterion for the planned performance of an examination. If such a prioritization is present, compliance with the threshold value is always the principle priority. The operating safety of the magnetic resonance facility is then considered, for example avoiding the disintegration of the superconductor (quenching). Any attempt to maintain the planned performance of the examination is of lower priority.

Different variants of the disclosed method are possible here, which can also be used in combination. While it is possible always to consider the "power budget" only at the current time, it is also conceivable to make prior calculations and utilize the further degree of freedom of a change in the time sequence of power consumption.

Provision can be made for a current power consumption to be determined for each component and to be taken into account during control. In a specific embodiment provision can be made for the determination of the current power consumption to take place using at least one sensor, such as a current sensor and a voltage sensor, and/or taking into account current operating parameters of the magnetic resonance facility. The current power consumption of components can be determined directly for example, by measuring the power consumption using a current sensor and a voltage sensor. It is however also conceivable to proceed computationally. In other words for example it is easy to calculate from the parameters of the current pulse sequence what power consumption is expected at the amplifiers. It is thus possible always to take account of the power consumption of the component in the most current manner. If there is a threat that the threshold value will be exceeded, the criteria can be used to implement a measure, for example modification of an ongoing pulse sequence, temporary deactivation of the cold head or the like.

In an embodiment of the present application provision is made however for the power consumption of at least one component to be calculated beforehand as a function of a planned examination described by an examination protocol for activating the magnetic resonance facility with at least one sequence and/or a of a status parameter describing an ambient condition or an operating state of the magnetic resonance facility. It is conceivable to calculate beforehand the power consumption of the components used, such as the amplifiers, with knowledge of examinations to be performed in the future. As far as components that are not associated directly or in a predictable manner with examination protocols are concerned, it is possible to take into account ambient conditions or status parameters describing operating states or, in the case of a cold head for example, it is assumed that it will be operated at a defined, constant level. In each instance such a prior calculation allows any future exceeding of the threshold value to be identified and also allows the additional degree of freedom of the time sequence of power consumption by the components to be used and taken into consideration. It is thus possible at an early stage to plan the use of the magnetic resonance facility so that the threshold value is not exceeded where possible.

In a specific embodiment provision can be made for the prior calculation to take place taking into account examination data measured during previous examinations. This means that a type of learning system can be achieved, which measures and stores the power consumption of components for certain predetermined examination protocols or just certain constellations of operating parameters of components, so that the power consumption is known when the examination protocol or the set of operating parameters is used repeatedly. Naturally it is also possible, rather than considering such measurement data, also to perform calculations, for example in the context of a simulation or model.

Provision can expediently also be made for a time sequence of future examinations and/or further examination-related information to be retrieved from an information system, such as a hospital information system and/or a radiology information system. If future examinations are not stored routinely on the magnetic resonance facility itself, it is possible to determine the information required for a prior calculation from an information system. Such an information system can also contain additional information relating to the examinations, for example the purpose of the examination, the patient to be examined and the like. Knowledge about the diagnostic purpose of a magnetic resonance examination can be used for example in the context of criteria, when for example more efficient, in other words less power-consuming, possibilities are proposed for performing the examination and this will be examined in more detail below.

In one instance where the freedom to change the time sequence is used in the context of a criterion, provision can expediently be made, if the threshold value is exceeded for at least one examination, to change the time of the examination and/or the sequence of at least two examinations so that the threshold value is no longer exceeded. To this end further scenarios of future examination sequences for example can be calculated beforehand and checked to determine whether the threshold value is complied with in such time sequences. Other criteria and calculation options are of course also conceivable. If operating safety is primary for example, meaning that failure of the superconductor or the like must be prevented in an extremely reliable manner, it may be expedient instead to make modifications in the area of the examinations, which in the present instance is done by changing the sequence.

In a further embodiment of the present application, to comply with the threshold value, provision can be made for at least one operating parameter of the magnetic resonance facility contained in the examination protocol to be changed and/or for a sequence contained in the examination protocol to be adjusted or replaced. In this instance too use is made of the fact that a prior calculation exists, so that used sequences or parameters can be adjusted easily before the examination without directly compromising success. It is always taken into consideration when determining such proposed changes that the informative diagnostic content remains the same at least in respect of purpose after the modification. It is possible here to take into consideration the purpose of the examination, which can be identified for example from the examination protocol itself, has already been input at the magnetic resonance facility or has been retrieved from an information system. Certain examination protocols are also frequently already assigned to certain diagnostic questions. For example in this embodiment a database can be provided, which indicates possible modifications of operating parameters and sequences, so that a possibly more energy-efficient protocol or a protocol with a different power consumption pattern can be selected, with which the purpose of the examination is however still achieved.

If a number of possible changes have been determined or generally to inform and give consideration to the user, provision can be made for a proposed change to be displayed to a user and the change to be made after a proposed changed has been confirmed and/or selected by a user. In this embodiment a user is taken into consideration in that said user is fully informed of the adjustments and can for example select the proposed change that appears the most appropriate from the different ones available.

It should also be noted here that it is also conceivable in principle during an ongoing examination still to make adjustments to comply with the threshold value, for example if the gradient field strength can be reduced, the k-space has to be scanned less precisely or the like.

As mentioned above, for other components, it is also possible to calculate or estimate a future pattern of power consumption as a function of additional parameters. Provision can be made for the power consumption of at least one cooling facility cooling a coolant outside a building to be calculated beforehand from a measured and/or expected external temperature. Cooling facilities for further components of the magnetic resonance facility in addition to the basic field magnet, which can operate for example with water as the coolant, frequently operate with an apparatus located outside the building to cool the coolant to a specific temperature. The power consumption required here is predominantly a function of the nature of the ambient temperature there, in other words the external temperature. It can thus happen that in winter or the like the power consumption of such a cooling facility is lower than when the external temperatures are higher. This can also be taken into account by for example measuring current temperatures and concluding a future temperature from these or by using temperature predictions, for example in the form of a weather report, which can be retrieved for example by way of the internet. Additional parameters for some components allow more reliable prediction in the context of the prior calculation.

Provision can also be made for a currently valid threshold value to comprise a fixed, such as energy supply-specific, component value and/or a component value that can vary over time. The available budget maximum can thus be made up of different components, in this instance fixed component values and/or dynamically measured component values. While it is possible in principle to use a fixed threshold value or a threshold value set during installation of the magnetic resonance facility by a service engineer, on other words just one fixed component value, to use a dynamically variable threshold value or at least one dynamically variable component value, it being possible for a user also to set a specific component. In any case external influences can also be taken into account with component values that can vary over time.

One fixed component can be fixed for example for possible energy supplies at the magnetic resonance facility, for example a network supply and/or an emergency power supply, for example when the device is installed. Provision can be made for one fixed component value to be used for a network supply and one fixed component value to be used for an emergency power supply. Then for example when there is a switch to emergency power supply, the other fixed component value is used, but it should be noted that instead of this basic classification based on energy supply it is also possible to map the change of energy supply by way of a component value that can vary over time.

In one embodiment of the disclosed method provision can be made for a component value that can vary over time to be determined as a function of at least one measured measurement parameter that describes the current energy supply. It is conceivable to monitor the quality of the current power supply or energy supply, for example the current network quality, allowing a closer matching up of power availability and power requirement and a fast response. Specifically provision can be made here in the case of an alternating voltage supply for a voltage amplitude and/or a current amplitude and/or a phase relation and/or a frequency and/or a parameter describing a harmonic to be determined as the measurement parameter.

In this context it is advantageous if a measurement parameter pattern is stored and taken into account when calculating a pattern of the threshold value over time beforehand. At least one component value can then be selected for certain time periods as a function of the network quality determined until then. Continuous monitoring of a power network for example allows the implementation of a learning system. Network power drops, known as brown outs, often occur at similar times of the year or day. The magnetic resonance facility can thus determine prognoses for the future at its current installation site by continuously recording the power available from the energy supply and can take such prognoses into account when planning power consumption, such as for examinations which are close to the power limit. This allows operation of the magnetic resonance facility close to the limits defined by the network with efficient utilization of the same.

It is also expedient if a component value that can vary over time is determined as a function of a pattern of a power price over time. In recent times more and more price models have become known, in which the power price is a function of time. Such information can be obtained for example from the internet and can be taken into account in the context of the present application when calculating a pattern of the threshold value over time beforehand. A further temporal component value for example can be used for this purpose.

In one development of the disclosed method a maximum permissible heat input can be determined relating to the basic field magnet of the magnetic resonance facility, which is monitored in respect of being exceeded parallel to the threshold value for overall power consumption when calculating heat inputs during the performance of examination protocols beforehand and/or which is taken into account as a criterion when selecting the measures for complying with the threshold value for overall power consumption. It is conceivable to take account of "thermal budgets" as well as the "power budget" that is central to the present application, either as a specific restriction or at least when taking into account the criteria relating to the threshold value for overall power consumption. For example the currently possible heat input into the magnet that is achievable with stable operation can be considered for this purpose. Such a maximum permissible heat input can be determined for example from sensor data, which indicates the ratio of gaseous coolant, such as helium, to liquid coolant. The use of a large quantity of coolant, such as helium, for cooling the basic field magnet, means that the cooling facility for the basic field magnet has a certain inertia, as described above, so a certain heat input is possible without any problems, if sufficiently liquid coolant is still present. With regard to the prior calculation of the effects of examination protocols to be used, the consideration of such a maximum permissible heat input is useful since the eddy currents generated by the gradient coils and the high-frequency coils for example, in the magnet housing, and the resulting heat input can also be calculated beforehand. This makes it possible to determine what additional heat input will occur during the performance of an examination. It can then be determined whether it would be possible—naturally as a function of the current maximum permissible heat input—to temporarily deactivate the cold head and the like, in favor of strong gradients and so on, in other words in favor of greater power consumption by the amplifiers.

In a further embodiment of the present application provision can be made for at least one item of information derived from a comparison of at least one determined current and/or previously calculated overall power consumption with the threshold value for overall power consumption to be displayed on a display facility. It is conceivable to show a user the "power budget" so that said user is kept constantly informed. A graphic display for example is conceivable, such as using bar charts, colored traffic lights and the like. Numerical displays are also possible. A corresponding display can also be considered in respect of a "thermal budget", in other words when determining a maximum permissible heat input.

As already mentioned several times above, provision can be made for at least one inertia of a cooling facility, such as of a cooling facility for the basic field magnet of the magnetic resonance facility, to be taken into account as a criterion or in the context of a criterion. Components, such as cooling facilities, can have a high level of inertia. For example modern cooling facilities can contain a large quantity of liquid helium, so the basic field magnet only heats up very slowly even if the cold head does not run or only runs at low power for some time. An additional freedom results from regulation of the operation of the cold head and/or regulation of its power consumption. Provision can be made for the inertia of at least one cooling facility to be increased, by providing a larger quantity of coolant. The inertia of cooling facilities can also be artificially increased, for example by increasing the quantity of liquid in the cooling system for the gradients and electronics. This opens up greater freedom in the regulation of the current power consumption below the threshold value.

As well as the method the application also relates to a magnetic resonance facility, comprising a number of power-consuming components, means for determining the power consumption for each component and an energy control facility for controlling the operation of the components based on at least one criterion so that a predetermined threshold for the overall power consumption of the magnetic resonance facility is not exceeded. All the statements relating to the disclosed method can be applied analogously to the disclosed magnetic resonance facility, with which it is also possible to achieve the same advantages. Provision can be made for the energy control apparatus to be configured to perform the disclosed method in one of the described embodiments.

BRIEF DESCRIPTION OF THE DRAWINGS

Details of the present application will emerge from the embodiments described in the following and from the drawing. The single FIGURE shows a basic outline of a disclosed magnetic resonance facility.

DETAILED DESCRIPTION OF APPLICATION

The FIGURE shows a basic outline of a disclosed magnetic resonance facility 1. As usual this comprises a basic field magnet 2, a gradient coil arrangement 3 and a high-frequency coil arrangement 4 (only shown schematically here), which are generally disposed around a patient support (not shown) and can be operated to record magnetic resonance images. Because a superconducting coil is used as the basic field magnet 2, it is operated by a cooling facility 5 with a cold head 6. Provided as coolant in the cooling facility 5 is a large quantity of liquid helium, so the system responds sluggishly, which means that, even with reduced operation of the cold head 6, such as of the compressor of the cold head 6, or with the cold head 6 deactivated, depending on the ratio of liquid coolant to gaseous coolant some time can pass before the heating of the basic field magnet 2 actually reaches critical regions. A sensor 7 can be used, for example based on a level of the liquid coolant, such as helium, to measure this ratio, so that a maximum permissible heat input can be determined, at which the system still remains stable. This will be examined in more detail below.

The magnetic resonance facility 1 also comprises a further cooling facility 8, which is configured to cool the gradient coils, in some instances the high-frequency coils and the electronics of the magnetic resonance facility 1. Water is provided as coolant here, being present outside the building in which the imaging components of the magnetic resonance facility 1 are disposed. The external temperature, which can be measured by way of a sensor 9, has a significant influence on the power consumption of the cooling facility 8. This is also provided with a larger quantity of coolant, in order to increase the inertia here too.

Assigned to the gradient coil arrangement 3 and the high-frequency coil arrangement 4 as further components of the magnetic resonance facility 1 are amplifiers 10, 11, which can comprise individual amplifier facilities for example for each channel and/or each coil.

User inputs can be accepted and information can be displayed to a user by way of a display apparatus 12 and an operating apparatus 13. The magnetic resonance facility 1 also comprises an image computer 14, which can have a number of processors.

For its power supply the magnetic resonance facility 1 has a connector 15, by way of which it can be connected to an energy supply, an alternating voltage network 16 and an emergency power supply 17 being shown here by way of example.

One feature of the magnetic resonance facility 1 is an energy control facility 18, which is configured to execute the disclosed method, thus to control the operation of power-intensive components based on at least one criterion so that a predetermined threshold value for overall power consumption of the magnetic resonance facility 1 is not exceeded.

Components considered as power-intensive here in the context of energy control are the cold head 6, the cooling facility 8, the amplifiers 10 and 11 and the image computer 14. A sensor arrangement 19, comprising a current sensor and a voltage sensor, is assigned to each of these components for determining power consumption. This allows a current power consumption of the components to be determined. The energy control facility 18 itself however also comprises means for calculating the power consumption of components beforehand, in other words further means for determining power consumption.

The energy control facility 18 has access to an information system 20, in this instance a radiology information system, as well as the internet 21. Information about future examinations planned using the magnetic resonance facility 1 can be retrieved from the radiology information system 20, while power price models and predicted external temperatures and in some instances further information for example can be obtained from the internet.

The energy control facility 18 constantly monitors the power requirement of the system and ensures that a certain threshold value ("power budget") is not exceeded. In the present instance the available budget maximum, in other words the threshold value, can be determined from different parameters, in this instance fixed component values and component values that can vary over time, which means that the threshold value for the overall power consumption of the magnetic resonance facility 1 is generally a function of time. Different threshold values are defined for different time periods or phases in this process. Component values of the threshold value are a function of time, it being possible for example to take into account information relating to the power price pattern retrieved from the internet 21 in the context of a component value that can vary over time. If the power price is low, higher threshold values can be permitted than when power prices are high. However network quality is also monitored here. To this end a sensor system 22 is provided, which can monitor for example the voltage amplitude and/or the current amplitude and/or the phase relation and/or the frequency and/or the harmonic composition of the frequencies of the alternating voltage network 16, to check how much power is currently available. This also allows a fast response, which is described further below based on an example.

The data recorded when monitoring the alternating voltage network 16 is however also stored and further evaluated, to implement a learning system. For example network power drops, known as brown outs, often occur at similar times of the year and/or day. The energy control facility 18 is thus able, by continuously monitoring and recording the power available to the current installation site of the magnetic resonance facility 1, to make prognoses for the future and take these into account for energy management, so that the magnetic resonance facility 1 can be operated as close as possible to the limits defined by the alternating voltage network 16.

It should also be noted here that a pattern of the threshold value for overall power consumption can generally be calculated beforehand, which is used in the context described in more detail below that the power consumption of the components can also be prioritized.

It should also be noted here that in the rare instance of a switch to the emergency power supply 18 a lower threshold value is selected, which can be implemented by way of different fixed "basic" component values or a component value that can vary over time.

As mentioned above, the energy control facility 18 can determine the current power consumption directly by measurement, such as by the sensor arrangements 19. However this is also conceivable computationally, when an examination is being performed based on an examination protocol containing operating parameters. It is thus possible to respond to current instances of the threshold value being exceeded. However prior calculation of the power consumption of the components also takes place, so that instances where the threshold value for overall power consumption is exceeded can be anticipated and changes can thus be made in the time sequence.

If there is a threat of the threshold value being exceeded, the energy control facility 18 reduces the power consumption of at least one component according to an established strategy determined by the criteria. The following priorities are taken into account here: compliance with the threshold value for overall power consumption has the highest priority. This is followed by the operating safety of the magnetic resonance facility 1, for example avoiding the disintegration of the superconductor. Finally attention is also given to performing an examination as closely as possible to the planned manner.

In this context it is conceivable as a measure that, because of the slow heating of the basic field magnet due to the inertia of the cooling facility 5, the cold head 6 is temporarily not operated or is only operated at lower power. However other measures are also possible, for example reducing the gradient strength or transmit power of the high-frequency antenna arrangement 4 and the like.

As well as monitoring the "power budget", the energy control facility 18 also monitors a "thermal budget", in that a current maximum permissible heat input into the basic field magnet 2 is monitored, so that stable operation is ensured. This can be determined based on the measurement values of the sensor 7, as mentioned above.

Planned examinations using the magnetic resonance facility 1 are also stored in the magnetic resonance facility 1 or in the information system 20, for example in the form of a list. These can be evaluated so that it can be calculated beforehand based on the power consumption profile of the components at what point measures can be taken or changes can be proposed to avoid power peaks in the future when the threshold value is exceeded. Such proposed changes can be displayed on the display apparatus 12 and the operating apparatus 13 can be used by the user to select or confirm a change to be made. The display facility 12 can also be used to display the "power budget" and the "thermal budget" graphically, thereby displaying information derived from a comparison of current or reduced power consumption values with the threshold value and/or or previously calculated heat inputs with the maximum permissible heat input, for example in the form of bar charts, colored traffic lights, numerical displays and the like.

It should also be noted here that the power consumption of the components, as determined for example using the sensor arrangements 19, can be held in the energy control facility 18, since such data can be used to supply data for the prior calculation of power consumption for similar examinations and identical sets of operating parameters.

The disclosed management of the power consumption of the magnetic resonance facility 1 and its components will be described in more detail below based on a number of examples.

If, at the start of a pulse sequence, the energy control facility 18 determines that the threshold value would be exceeded due to the required gradient activity, but the quantity of currently liquid helium in the cooling facility 5 is sufficiently great, the power of the cold head 6 is reduced during the gradient activity and then increased again. This allows compliance with the threshold value.

However if the energy control facility 18 determines that the threshold value would be exceeded, but at the same time the quantity of liquid helium is at a critical level, the maximum permissible energy input is very low, the power of the cold head 6 is not reduced but the pulse sequence is changed so that the power consumption of the amplifier 10 and/or the amplifier 11 drops, for example due to lower gradient amplitudes, an increase in repetition times or a reduction of the high-frequency amplitudes.

If, in a further example for the current working day, two examinations, which require a very high gradient system power, are planned immediately after one another, the energy control facility 18 can determine during a simulation that the first examination would be possible if the cold head 6 were operated at lower power during this time but the "thermal budget", in other words the maximum permissible heat input into the basic field magnet 2, would be used up during the second examination. It is proposed to the user that either the sequence of the examinations should be changed or the gradient amplitude should be reduced.

In another instance the energy control facility 18 determines, for two examinations, which require very high gradient system power, that the examinations are not possible with the given threshold value or would require a change to the planning as described above. If an examination is not possible or a change to the planning is not desirable, it is possible to propose not only an alternative parameterization of the examination protocol or sequence but also a different sequence type of a different contrast comparison, which is clinically equally informative but requires less power. To this end for example the purpose of an examination can be considered, with possibly exchangeable examination protocols and sequences being stored in a database and available for access by the energy control facility 18.

In a further embodiment the regular power supply, in other words the alternating voltage network 16, fails during an examination and a switch is made to the emergency power supply 17. This reduces the threshold value, in other words the power budget, to a surprising degree. The energy control facility 18 responds by deactivating the cold head 6, reducing the power of the cooling facility 8 and changing the sequence parameters to reduce gradient amplitude, so that the current examination can still be completed despite the power failure.

In the case of measurements, with which the time sequence is triggered by the physiology of the patient, the energy control facility 18 can respond for example with a time extension measurement. If a heart measurement is performed in the segmented k-space, the energy requirement can be reduced by only performing an acquisition every second heartbeat or by increasing the segment count of the k-space. This requires a lower slew rate and/or a lower high-frequency amplitude, so the power is reduced.

It is also conceivable within the scope of the application for a user to be informed if a break is required before a subsequent examination, to fill up the "thermal budget" again, allowing deactivation of the cold head 6 for example if high gradient amplitudes are required.

The present application clearly allows provision to be made for a lower maximum power consumption of the magnetic resonance facility 1, thereby setting less stringent requirements for the power network and the emergency power supply.

Although the application has been illustrated and described in detail using the embodiment, the application is not restricted by the disclosed examples and other variations can be derived from by the person skilled in the art without departing from the scope of the application.

The invention claimed is:

1. A method for operating a magnetic resonance apparatus having a plurality of power consuming components, comprising:
    determining a power consumption for each of the power consuming components of the magnetic resonance apparatus by an energy control facility, wherein the power consuming components comprise a cooling facility with a cold head for a basic field magnet, a cooling facility for a gradient coil or a high-frequency coil, and an amplifier for the gradient coil, and an amplifier for the high-frequency coil; and
    controlling the power consumption of the each of the power consuming components by the energy control facility based on a criteria so that a threshold value for a power consumption of the magnetic resonance apparatus is not exceeded, wherein the criteria comprises a safety operation of the magnetic resonance apparatus, and a planned performance of the magnetic resonance apparatus.

2. The method as claimed in claim 1, wherein a current power consumption of the each of the components is determined and is taken into account during the control.

3. The method as claimed in claim 1, wherein a power consumption of at least one of the components is calculated beforehand as a function of a planned examination described by an examination protocol for activating the magnetic resonance facility with a sequence, and/or as a function of a status parameter describing an ambient condition or an operating state of the magnetic resonance facility.

4. The method as claimed in claim 3, wherein a time of the planned examination and/or the sequence of at least two examinations is changed if the threshold value is exceeded so that the threshold value is no longer exceeded.

5. The method as claimed in claim 4, wherein an operating parameter of the magnetic resonance facility in the examination protocol is changed and/or a sequence in the examination protocol is adjusted or replaced.

6. The method as claimed in claim 4, wherein the change is displayed to a user for confirmation and/or for selection and is made after the confirmation and/or the selection.

7. The method as claimed in claim 1, wherein the threshold value comprises a fixed energy supply-specific component value and/or a varied component value over time.

8. The method as claimed in claim 7, wherein the varied component value over time is determined as a function of a measured measurement parameter describing a current energy supply.

9. The method as claimed in claim 8, wherein a measurement parameter pattern is stored and is taken into account in calculating a pattern of the varied component value over time.

10. The method as claimed in claim 7, wherein the varied component value over time is determined as a function of a pattern of a power price over time.

11. The method as claimed in claim 1, wherein a maximum permissible heat input is determined beforehand relating to a basic field magnet of the magnetic resonance facility.

12. The method as claimed in claim 11, wherein a heat input is determined during performing an examination protocol and is monitored in respect of being not exceeding the maximum permissible heat input in parallel to the threshold value for the overall power consumption.

13. The method as claimed in claim 11, wherein the criterion relates to the maximum permissible heat input.

14. The method as claimed in claim 1, wherein the criterion relates to an inertia of a cooling facility for a basic field magnet of the magnetic resonance facility.

15. A magnetic resonance apparatus, comprising:
    a plurality of power consuming components, wherein the power consuming components comprise a cooling facility with a cold head for a basic field magnet, a cooling facility for a gradient coil or a high-frequency coil, and an amplifier for the gradient coil, and an amplifier for the high-frequency coil; and
    an energy control facility for determining a power consumption for each of the power consuming components and controlling the power consumption of the each of the power consumption components based on a criterion so that a threshold value for a power consumption of the magnetic resonance apparatus is not exceeded, wherein the criteria comprises a safety operation of the magnetic resonance apparatus, and a planned performance of the magnetic resonance apparatus.

\* \* \* \* \*